(12) United States Patent
Chen

(10) Patent No.: US 8,476,089 B2
(45) Date of Patent: Jul. 2, 2013

(54) METHOD FOR MANUFACTURING LIGHT EMITTING DIODE PACKAGE

(75) Inventor: Pin-Chuan Chen, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/452,960

(22) Filed: Apr. 23, 2012

(65) Prior Publication Data
US 2012/0315713 A1   Dec. 13, 2012

(30) Foreign Application Priority Data
Jun. 8, 2011   (CN) .......................... 2011 1 0152295

(51) Int. Cl.
*H01L 21/00* (2006.01)

(52) U.S. Cl.
USPC ............... 438/27; 438/26; 438/29; 438/42; 438/69; 438/72; 257/98

(58) Field of Classification Search
USPC ............... 438/26, 27, 29, 42, 69, 72; 257/98
See application file for complete search history.

(56) References Cited

U.S. PATENT DOCUMENTS

| 6,874,910 | B2 * | 4/2005 | Sugimoto et al. | 362/294 |
| 8,030,674 | B2 * | 10/2011 | Hsu et al. | 257/98 |
| 8,158,990 | B2 * | 4/2012 | Joichi et al. | 257/84 |
| 8,373,189 | B2 * | 2/2013 | Lin et al. | 257/98 |
| 2005/0139846 | A1 * | 6/2005 | Park et al. | 257/98 |
| 2008/0296599 | A1 * | 12/2008 | Mazzochette | 257/98 |
| 2011/0233594 | A1 * | 9/2011 | Hsu et al. | 257/98 |

* cited by examiner

*Primary Examiner* — Jarrett Stark
*Assistant Examiner* — Nicholas Tobergte
(74) *Attorney, Agent, or Firm* — Altis Law Group, Inc.

(57) ABSTRACT

A method for manufacturing an LED package, comprising steps of: providing a substrate, the substrate forming a plurality of spaced rough areas on a surface thereof, each of the rough areas forming a rough structure thereon, a block layer being provided on a remaining part of the surface of the substrate relative to the rough areas; forming a metal layer on a top surface of each rough structure; forming a reflector on the substrate, the reflector defining a cavity and surrounding two adjacent metal layers; arranging an LED chip in the cavity, the LED chip electrically connecting to the two adjacent metal layers; forming an encapsulation layer in the cavity to seal the LED; and separating the substrate from the metal layers, the encapsulation layer and the reflector.

17 Claims, 14 Drawing Sheets ically insu-
METHOD FOR MANUFACTURING LIGHT EMITTING DIODE PACKAGE

BACKGROUND

1. Technical Field

The present disclosure relates to a method for manufacturing light emitting diode (LED) packages, and more particularly, to a method for manufacturing a low-profiled LED package with a reduced thickness.

2. Description of Related Art

LEDs have been widely promoted as a light source of electronic devices owing to many advantages, such as high luminosity, low operational voltage and low power consumption. Due to miniaturization tendency of electronic devices, an LED package is required to be thinner and thinner. As such, how to achieve an overall thickness reduction of the LED package becomes an important issue.

What is needed therefore, is a method for manufacturing an LED package with a reduced thickness.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Referring to FIGS. 1-10, a process/method for manufacturing an LED package 1 in accordance with an embodiment of the present disclosure is disclosed. The method mainly includes multiple steps as described below.

Figure 1:
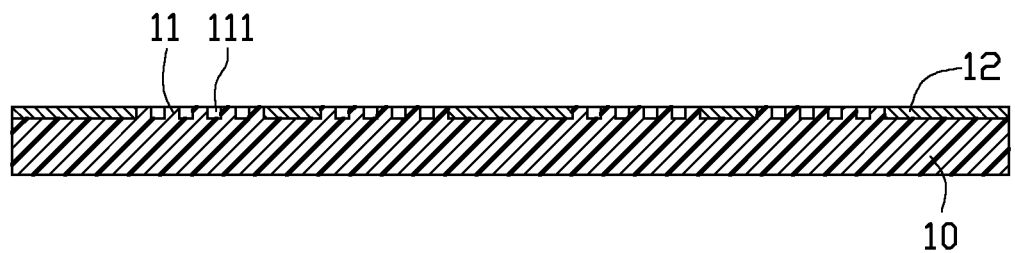
FIG. 1 shows a first step of a process for manufacturing an LED package in accordance with an embodiment of the present disclosure.
Figure 2:
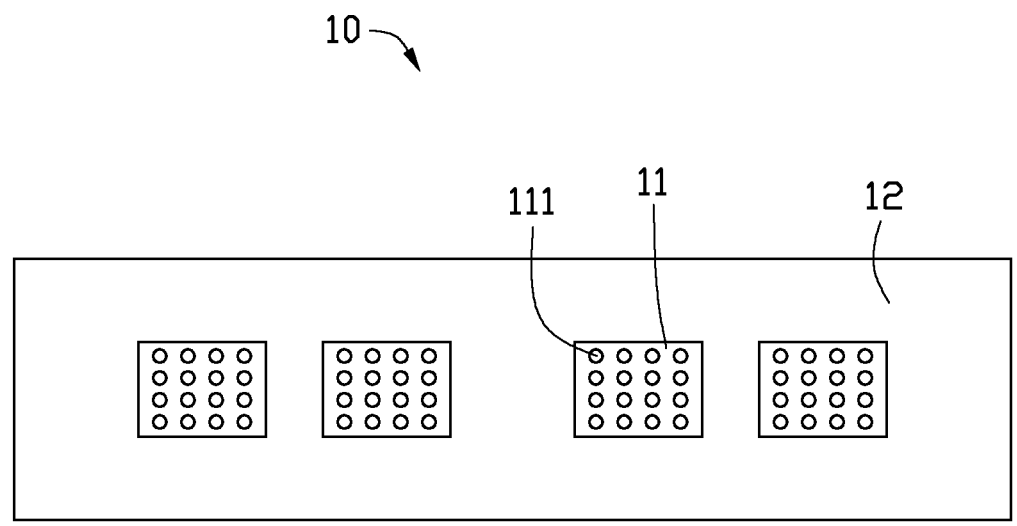
FIG. 2 shows a top view of a semi-finished product obtained from the first step of the process for manufacturing the LED package of FIG. 1.

As shown in FIGS. 1 and 2, a substrate 10 is provided. The substrate 10 forms a plurality of spaced rough areas 11 on selected parts of a top surface thereof, and each of the rough areas 11 forms a rough structure thereon. A block layer 12 is provided on a remaining part of the top surface of the substrate 10. The block layer 12 surrounds the rough areas 11. In this embodiment, a top surface of each rough area 11 is coplanar with that of the block layer 12. The rough structure of each rough area 11 includes a plurality of spaced pits 111 defined therein. The pits 111 can be arranged in any way as required. The pits 111 can be filled with an electrically insulating material, such as silica ($SiO_2$), etc. The rough structure of each rough area 11 can be formed by electroforming, printing or developing, etc. The block layer 12 is made of an electrically insulating material, such as $SiO_2$, etc.

Figure 3:
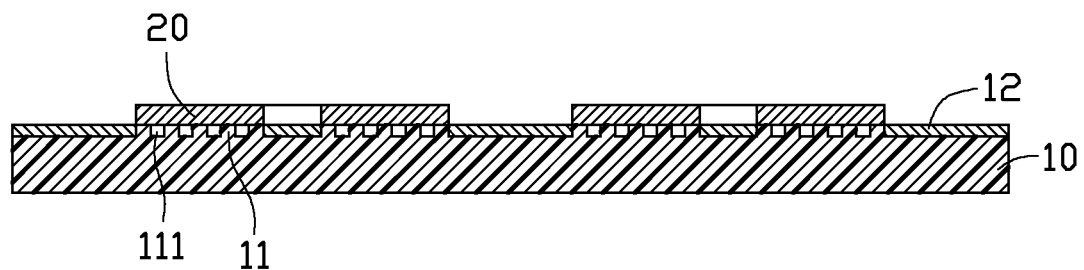
FIGS. 3 and 4 respectively show a second and a third step of the process for manufacturing the LED package in accordance with the embodiment of the present disclosure.

As shown in FIG. 3, a plurality of metal layers 20 are provided. Each of the metal layers 20 is adjacent to the block layer 12, and formed on the top surface of a corresponding rough area 11. That is, each two adjacent metal layers 20 are spaced by the block layer 12 formed therebetween. In this embodiment, the metal layers 20 are formed on the rough areas 11, respectively, by electroforming.

Figure 4:
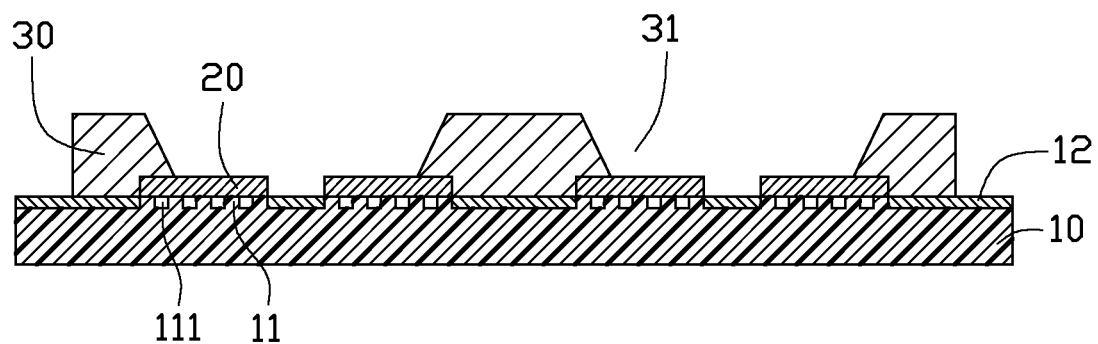
Figure 5:
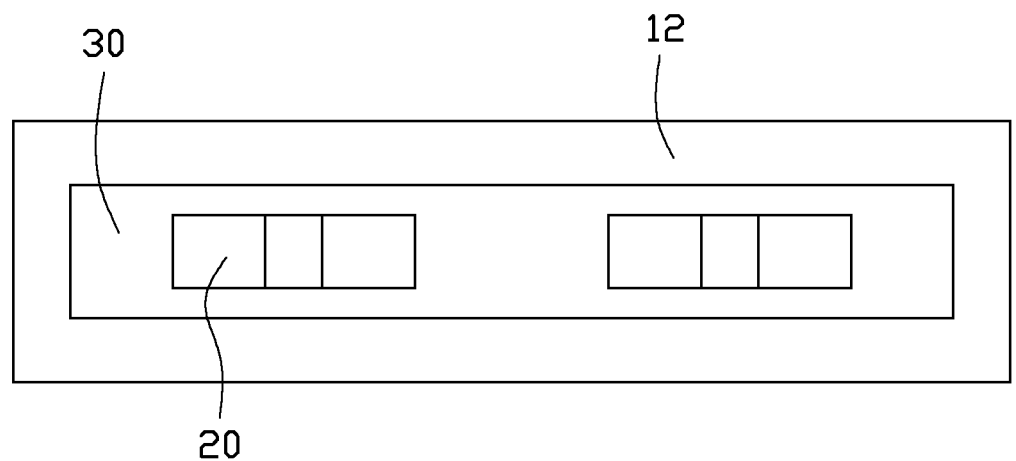
FIG. 5 shows a top view of another semi-finished product obtained from the third step of the process for manufacturing the LED package of FIG. 4.

As shown in FIGS. 4 and 5, a plurality of reflectors 30 are provided. The reflectors 30 are formed on the substrate 10. Each reflector 30 is in a form of a cup defining a cavity 31 which receives two adjacent metal layers 20 therein. In this embodiment, the cavity 31 has a shape of a substantially inverted truncated cone. The metal layers 20 are positioned at a bottom of the cavity 31. Alternatively, the cavity 31 can also be other shapes, for example, a cylinder-like shape.

Figure 6:
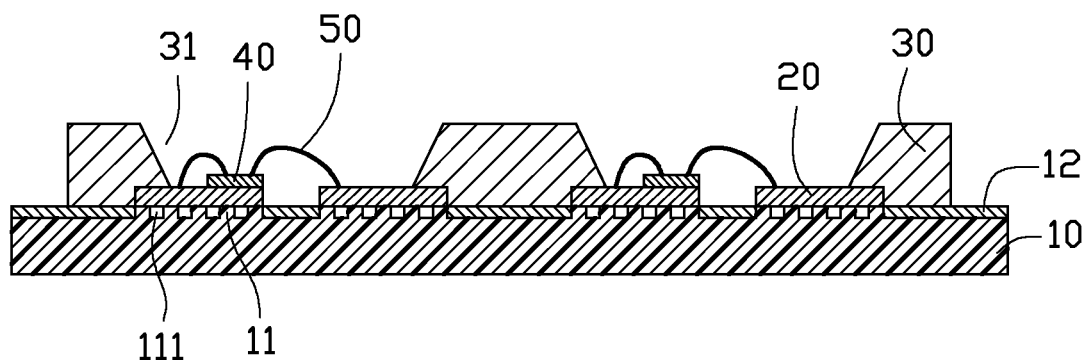
FIGS. 6-10 show follow-up steps of the process for manufacturing the LED package in accordance with the embodiment of the present disclosure.

As shown in FIG. 6, a plurality of LED chips 40 are provided. Each of the LED chips 40 is disposed in the cavity 31 of a corresponding reflector 30, and adhered to one of the metal layers 20. Each LED chip 40 is electrically connected to the two adjacent metal layers 20 by metal wires 50. Alternatively, each LED chip 40 can also be electrically connected to the metal layers 20 by using a flip-chip method. The two adjacent metal layers 20 perform as a pair of electrodes of the LED package 1. The two adjacent metal layers 20 can be electrically connected to an external power supply, such as PCB, to transfer external power to the LED chip 40.

Figure 7:
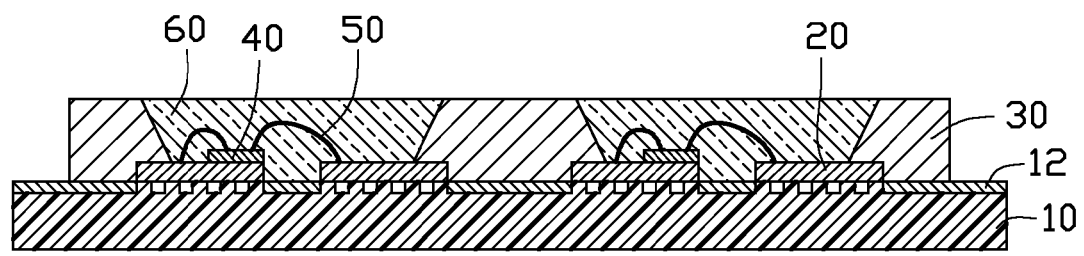

As shown in FIG. 7, an encapsulation layer 60 is provided in the cavity 31 of each reflector 30 to seal a corresponding LED chip 40. In this embodiment, the encapsulation layer 60 is injected into the cavity 31 by glue-dispensing processing. The encapsulation layer 60 is then pressed by a mold (not shown) until a top of the encapsulation layer 60 is coplanar with a top of the reflector 30, whereby the cavity 31 is completely filled with the encapsulation layer 60. In addition, a phosphor (not shown) can be mixed in the encapsulation layers 60 to obtain a desired color of light of the LED package 1.

Figure 8:
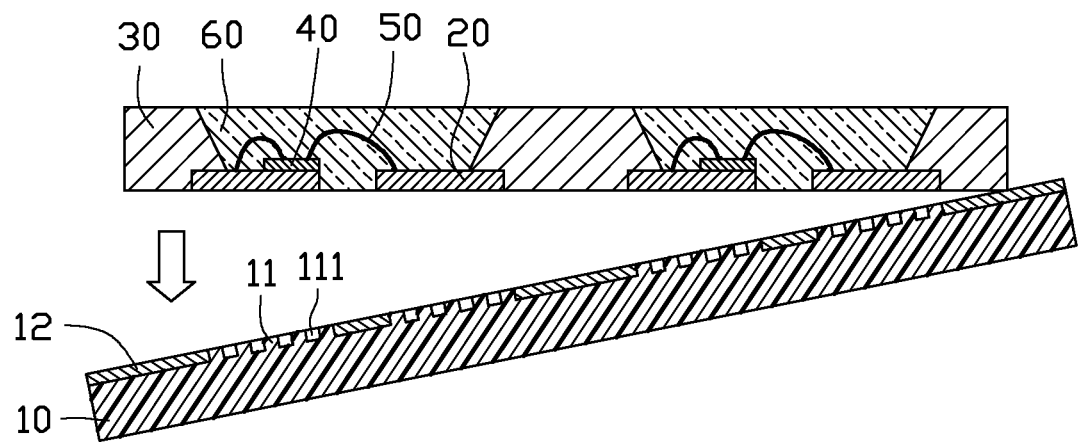

As shown in FIG. 8, the metal layers 20 and the reflectors 30 are separated from the substrate 10 by mechanical means. Because an adhering force between the block layer 12 of the substrate 10 and the reflector 30 is weak, and an adhering force between the rough areas 11 of the substrate 10 and the metal layers 20 is also weak due to a loose adhesion therebetween, the metal layers 20 and the reflectors 30 can be easily peeled off the substrate 10. Thus, the substrate 10 can be used again.

Figure 9:
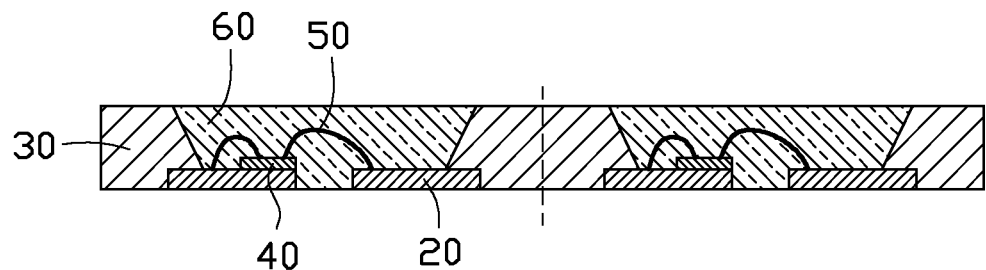
Figure 10:
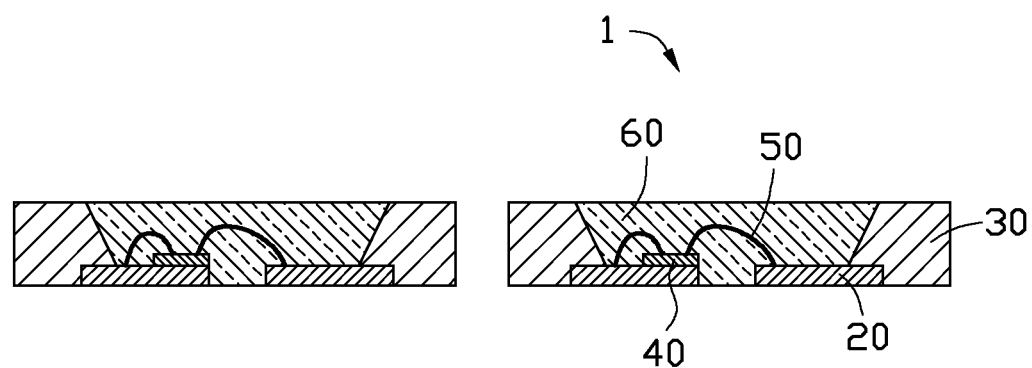

As shown in FIG. 9, the structure including the metal layers 20, the reflectors 30, the LED chips 40, the metal wires 50 and the encapsulation layers 60 after the substrate 10 peeled off the structure is cut into a plurality of separated LED packages 1 as shown in FIG. 10. Each of the LED packages 1 includes the two metal layers 20 used as a pair of electrodes, the LED chip 40 mounted on one of the two metal layers 20 and electrically connected to the two metal layers 20, the reflector 30 surrounding the LED chip 40, and the encapsulation layer 60 encapsulating the LED chip 40 therein. In comparison with a conventional LED package, the LED package 1 in accordance with the present disclosures does not have a substrate for supporting the afore-mentioned components; thus, a profile of the LED package 1 can be relatively low.

As described above, the substrate 10 forms rough areas 11 thereon, such that a contacting area between the substrate 10 and the metal layers 20 is reduced, thereby decreasing an adhering force therebetween. Therefore, it is easy to separate the metal layers 20 from the substrate 10. In addition, the LED chip 40 directly contacts the metal layer 20, such that heat from the LED chip 40 can be effectively dissipated by the metal layer 20, whereby heat-dissipation efficiency of the LED package 1 is optimized, and lifespan of the LED chip 40 can be extended.

Referring to FIGS. 11-14, the present disclosure also provides a method for manufacturing the substrate 10 which includes the following steps.

Figure 11:
FIGS. 11-14 show different steps for manufacturing a substrate of FIG. 1.

As shown in FIG. 11, a metal plate 70 is provided.

Figure 12:
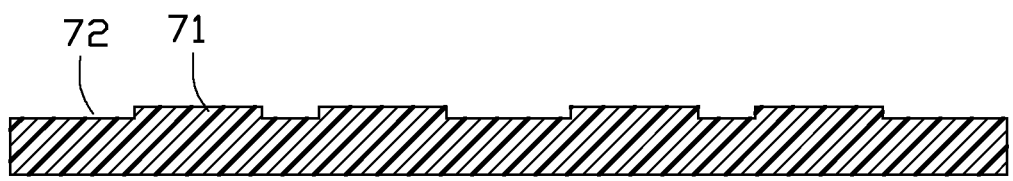
Figure 13:
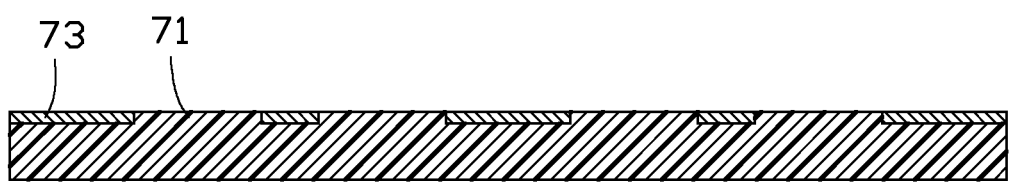
Figure 14:
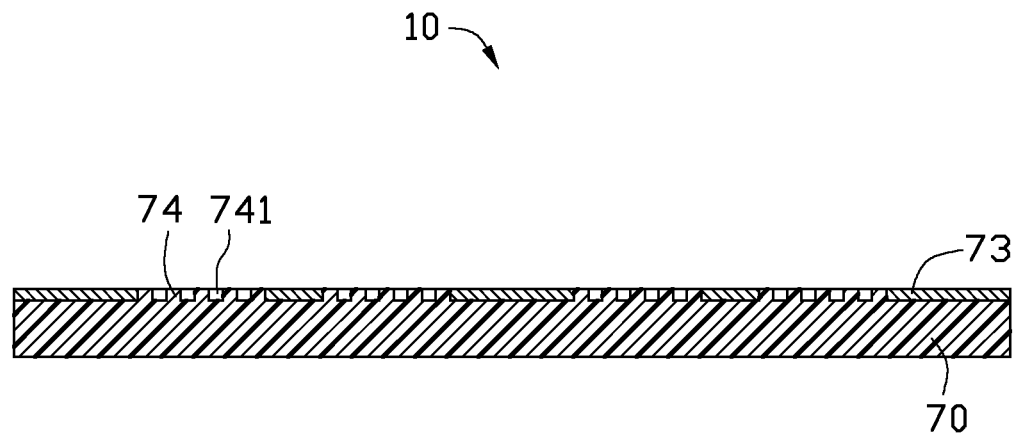

As shown in FIGS. 12-14, a plurality of protrusions 71 are formed on a top surface of the metal plate 70. The protrusions 71 are spaced from each other, such that the metal plate 70 defines a plurality of grooves 72 at a remaining part of the top surface of the metal plate 70 relative to the protrusions 71. In this embodiment, the protrusions 71 can be formed by micro image or pressing technology. The protrusions 71 are located at a middle portion of the metal plate 70, and each protrusion 71 is a small cuboid.

A block layer 73 is formed in the groove 72. The height of the block layer 73 is equal to that of the protrusion 71, so that the top surface of the block layer 73 is coplanar with that of the protrusion 71. The block layer 73 is made of an electrically insulating material, such as $SiO_2$, etc.

A rough structure 74 is formed on each protrusion 71. The rough structure 74 includes a plurality of pits 741 spaced from each other, and the pits 741 can be arranged in any way as required. The pits 741 can be filled with an electrically insulating material, such as $SiO_2$, etc. The rough structure 74 can be formed by electroforming, printing or developing et al.

After the steps mentioned above, the substrate 10 is obtained, wherein the block layer 73 forms the block layer 12, the rough structure 74 forms the rough structure of the rough area 11, and the pits 741 form the pits 111.

Particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A method for manufacturing at least an LED (light emitting diode) package, comprising steps of:
    providing a substrate, the substrate forming a plurality of spaced rough areas on a part of a surface thereof, each of the rough areas forming a rough structure thereon, a block layer being provided on a remaining part of the surface of the substrate relative to the rough areas, the block layer surrounding the rough areas;
    forming a plurality of metal layers over the substrate, wherein one metal layer is located on a top surface of a corresponding rough area;
    forming a reflector on the substrate, the reflector defining a cavity and surrounding two adjacent metal layers;
    arranging an LED chip in the cavity, the LED chip electrically connecting to the two adjacent metal layers;
    forming an encapsulation layer in the cavity to seal the LED chip; and
    separating the substrate from the metal layers, the encapsulation layer and the reflector, whereby the metal layers, the encapsulation layer, the LED chip and the reflector form the at least an LED package.

2. The method of claim 1, wherein the rough structure includes a plurality of spaced pits defined therein.

3. The method of claim 2, wherein each of the pits is filled with an electrically insulating material.

4. The method of claim 3, wherein the electrically insulating material is silica.

5. The method of claim 1, wherein the rough structure is formed by electroforming, printing or developing.

6. The method of claim 1, wherein the metal layer is formed on the rough structure by electroforming.

7. The method of claim 1, wherein the LED chip is electrically connected to the two adjacent metal layers by flip-chip or metal wires.

8. The method of claim 1, wherein the block layer is made of an electrically insulating material.

9. The method of claim 8, wherein the electrically insulating material is silica.

10. A method for manufacturing at least an LED (light emitting diode) package, comprising:
    providing a metal plate;
    forming a plurality of spaced protrusions on a part of a top surface of the metal plate, the metal plate defining a plurality of grooves at a remaining part of the top surface of the metal plate relative to the protrusions;
    forming a block layer in the groove;
    forming a rough structure on each protrusion;
    forming a metal layer on a top surface of each rough structure;
    forming a reflector on the metal plate, the reflector defining a cavity and surrounding two adjacent metal layers;
    arranging an LED chip in each cavity, the LED chip electrically connecting to the two adjacent metal layers;
    forming an encapsulation layer in the cavity to seal the LED chip; and
    separating the metal plate from the metal layers, the encapsulation and the reflector, whereby the metal layers, the encapsulation layer, the LED chip and the reflector form the at least an LED package.

11. The method of claim 10, wherein the rough structure includes a plurality of spaced pits defined therein.

12. The method of claim 11, wherein each of the pits is filled with an electrically insulating material.

13. The method of claim 10, wherein the rough structure is formed by electroforming, printing or developing.

14. The method of claim 10, wherein the metal layer is formed on the top surface of each rough structure by electroforming.

15. The method of claim 10, wherein the LED chip is electrically connected to the two adjacent metal layers by flip-chip or metal wires.

16. The method of claim 10, wherein the block layer is made of an electrically insulating material.

17. The method of claim 16, wherein the block layer is made of silica.

* * * * *